United States Patent [19]

Min et al.

[11] Patent Number: 5,648,006
[45] Date of Patent: Jul. 15, 1997

[54] HEATER FOR CHEMICAL VAPOR DEPOSITION EQUIPMENT

[75] Inventors: Suk-Ki Min; Moo Sung Kim; Seong-Il Kim, all of Seoul; Yong Kim, Kyungki-Do, all of Rep. of Korea

[73] Assignee: Korea Institute of Science and Technology, Seoul, Rep. of Korea

[21] Appl. No.: 385,968

[22] Filed: Feb. 9, 1995

[30] Foreign Application Priority Data

Apr. 27, 1994 [KR]  Rep. of Korea .................. 9004/1994

[51] Int. Cl.$^6$ .................................................. H05B 3/68
[52] U.S. Cl. .............................................. 219/467; 118/724
[58] Field of Search ........................... 219/436, 457–459, 219/462–468; 118/725, 730, 50.1, 724

[56] References Cited

U.S. PATENT DOCUMENTS

| 3,541,305 | 11/1970 | Kuwayama et al. | 219/467 |
|---|---|---|---|
| 3,633,537 | 1/1972 | Howe | 118/730 |
| 4,296,311 | 10/1981 | Hagglund et al. | 219/467 |
| 4,447,711 | 5/1984 | Fischer | 219/467 |
| 5,232,509 | 8/1993 | Min et al. | |

OTHER PUBLICATIONS

Catalogue: "Tungsten" published by Metallwerk Plansee GmbH, Jun. 1988.
Catalogue: "Molybdenum" published by Metallwerk, Mar. 1988.

Primary Examiner—Teresa J. Walberg
Assistant Examiner—Sam Paik
Attorney, Agent, or Firm—Darby & Darby

[57] ABSTRACT

A heater for a chemical vapor deposition equipment includes a meandering heating wire made of either molybdenum or tungsten and having a diameter of about 1 mm. The heating wire is laid on a heater disc that is made of either molybdenum, tungsten or ceramic. The heater disc is holed at its center for receiving a susceptor rotating shaft. A plurality of heating wire fixtures support the heating wire on the heater disc while spacing the heating wire from the heater disc at an interval, thus to prevent the heating wire from directly contacting the heater disc. Each of the heating wire fixtures is provided with a pair of lateral through holes, that is, a heating wire hole formed in an upper section of each fixture and a fixing wire hole formed in a lower section of each fixture. The heater also includes heat resisting plates that are made of either molybdenum or tungsten and placed on the bottom surface and the side surface of the heater disc for preventing side and downward radiation of the heat of the heating wire. The heater heats a substrate to a high temperature not less than 1500° C. and achieves an excellent heating efficiency.

6 Claims, 2 Drawing Sheets

HEATER FOR CHEMICAL VAPOR DEPOSITION EQUIPMENT

BACKGROUND OF THE INVENTION

1. Field of the Invention

The present invention relates in general to a substrate heater installed in a reactor of a chemical vapor deposition equipment and used for heating a substrate or a susceptor and, more particularly, to a structural improvement in such a heater for heating the substrate or the susceptor to a high temperature while improving the heating efficiency.

2. Description of the Conventional Art

Recently, a variety of elements such as metals, ceramics, semiconductors, superconductors and plastics are produced through chemical vapor deposition processes in accordance with development of chemical vapor deposition techniques.

In the chemical vapor deposition process, the performance of the resulting products are influenced by how efficiently the substrate or the susceptor is heated by a heater. The heater is thus regarded as a very important element of the chemical vapor deposition equipment.

In the typical chemical vapor deposition equipment, the substrate is laid on a flat susceptor within a reactor and heated by a heater provided in a lower section of the susceptor. The shape of the heater should thus be flat. In addition, the susceptor is rotatable in order to achieve desired even heating of the substrate laid upon the susceptor. With the rotatable structure of the susceptor, the heater should not interfere with the rotating motion of the susceptor, and this restricts designing of the heater.

When the reactor of the chemical vapor deposition equipment is made of a ceramic material such as quartz, the substrate is not heated by the typical heater but is heated through high frequency heating. However, the use of high frequency heating is attended by limitation upon the reactor size and requires provision of thorough shielding for prevention of leakage of electromagnetic waves. Therefore, use of the chemical vapor deposition equipment using the high frequency heating undesirably increases the production cost. Another problem of the above chemical vapor deposition equipment is that it is large in size and, as a result, occupies a large space. Representative examples of typical materials for the heater of the chemical vapor deposition equipment is a kanthal wire or a nichrome wire. However, such a typical material for the heater is limited in its use in accordance with gases introduced into the reactor of the equipment and, furthermore, scarcely heats the substrate to a temperature higher than 1000° C.

There has been proposed another type of heater. In order to produce this heater, a thin graphite plate is appropriately machined and, thereafter, coated with either PBN (pyrolyric boron nitride) or SiC. The PBN or SiC coated graphite plate is, thereafter, holed at its center so as to form a rotating shaft hole for receiving a susceptor rotating shaft therein, thus to allow rotation of the susceptor. This heater, however, requires a particular technique in the connection of its electrodes, thus making the production process complicated. Another problem of this heater is that the heater, while being very expensive, nevertheless has a low impact resistance.

SUMMARY OF THE INVENTION

It is, therefore, an object of the present invention to provide a heater for a chemical vapor deposition equipment in which the above problems can be overcome and which includes a heating wire such as a molybdenum wire, repeatedly bent along a plane and fixed to a top surface of a heater disc, and heat resisting plates placed on the bottom surface and the side surface of the heater disc, thus to heat a substrate to a high temperature not less than 1500° C. and achieve an excellent heating efficiency.

To accomplish the above object, a heater for a chemical vapor deposition equipment in accordance with the present invention includes: a meandering heating wire made of either molybdenum or tungsten and having a diameter of about 1 mm, a heater disc made of either molybdenum, tungsten or ceramic, a heating wire fixture for supporting the heating wire on the heater disc while spacing the heating wire from the heater disc at an interval for preventing the heating wire from directly contacting with the heater disc, and heat resisting plates made of either molybdenum or tungsten and placed on the bottom surface and the side surface of the heater disc for preventing side and downward radiation of the heat of the heating wire.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
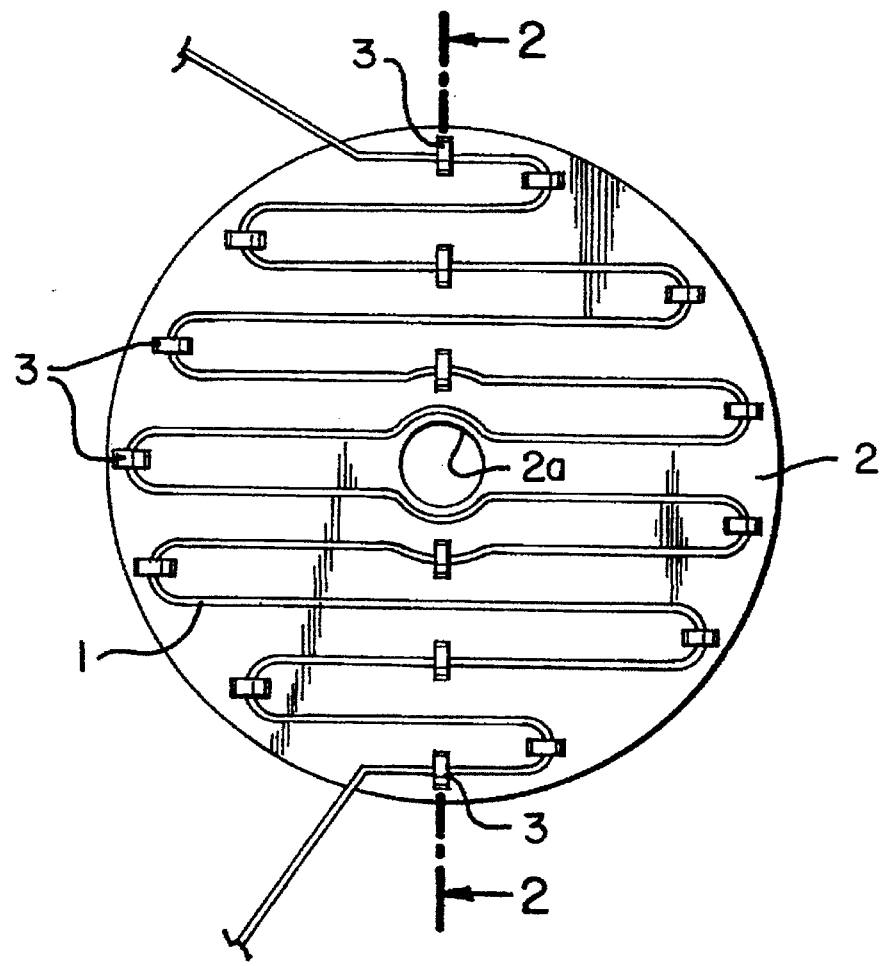
FIG. 1 is a plan view of a heater for a chemical vapor deposition equipment in accordance with the present invention.

Referring first to FIG. 1 showing in a plan view a heater for a chemical vapor deposition equipment in accordance with the present invention, the heater includes a meandering heating wire designated by the reference numeral 1. The meandering heating wire 1, which is repeatedly bent along a plane and is preferably made of molybdenum or tungsten and which has a diameter of about 1 mm, is laid upon a heater disc 2 and supported by a plurality of heating wire fixtures 3 in such a manner that the heating wire 1 is spaced apart from the top surface of the heater disc 2 at a predetermined interval. In the present invention, both the interval between the heating wire 1 and the heater disc 2 and the bending shape of the heating wire 1 may be changed as demands dictate. The heater disc 2 is holed at its center so as to form a rotating shaft receiving hole 2a therethrough for receiving a susceptor rotating shaft 10 therein.

Figure 2:
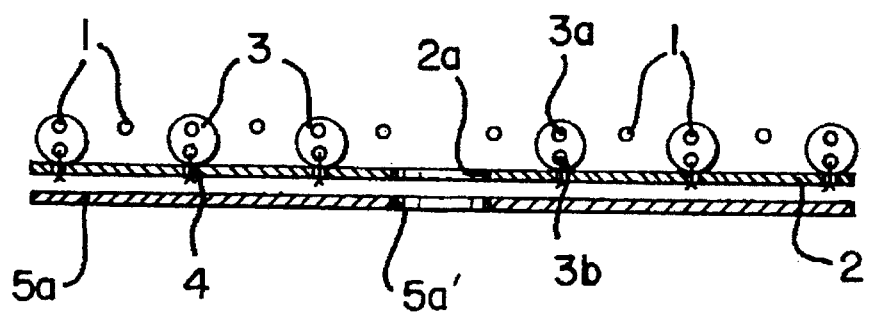
FIG. 2 is a cross-sectional view of the heater of FIG. 1 taken along the section line 2—2 therein.
Figure 3:
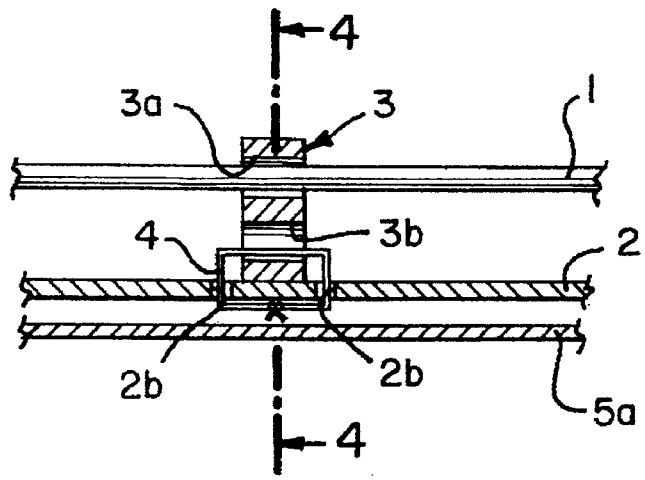
FIG. 3 is a partially enlarged cross-sectional view of the heater of FIG. 1, showing a heating wire fixture of the heater.
Figure 4:
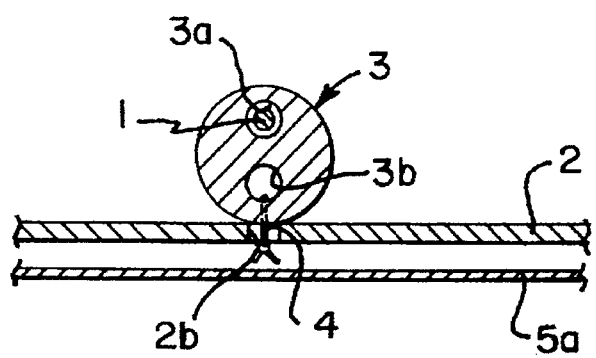
FIG. 4 is a cross-sectional view taken along the section line 4—4 of FIG. 3.

The heating wire supporting structure of each heating wire fixture 3 is shown in detail in FIGS. 2 to 4. As shown in these drawings, each heating wire fixture 3 is provided with a pair of horizontal through-holes, that is, a heating wire hole 3a formed horizontally through an upper section of each fixture 3 and a fixing wire hole 3b formed horizontally through a lower section of each fixture 3. The heating wire hole 3a of each fixture 3 receives the heating wire 3 while the fixing wire hole 3b of each fixture 3 receives a fixing wire 4 for fixing each fixture 3 to the heater disc 2. The fixing wire 4 is also received in a fixing wire hole 2b of the heater disc 2, so that the fixing wire 4 fixes each fixture 3 to the heater disc 2. With the above structure of each fixture 3, the meandering heating wire 1 is arranged in a plane above the heater disc 2 with the predetermined interval between the wire 1 and the heater disc 2.

In the present invention, the fixing wire 4 is preferably made of either molybdenum or tungsten.

Placed in parallel below the heater disc 2 is a bottom heat resisting plate 5a having the same shape as that of the heater disc 2. Where the heater disc 2 has the center rotating shaft receiving hole 2a, the bottom heat resisting plate 5a is holed at its center so as to form therethrough a corresponding hole 5a' for receiving the susceptor rotating shaft 10 therein.

Figure 5:
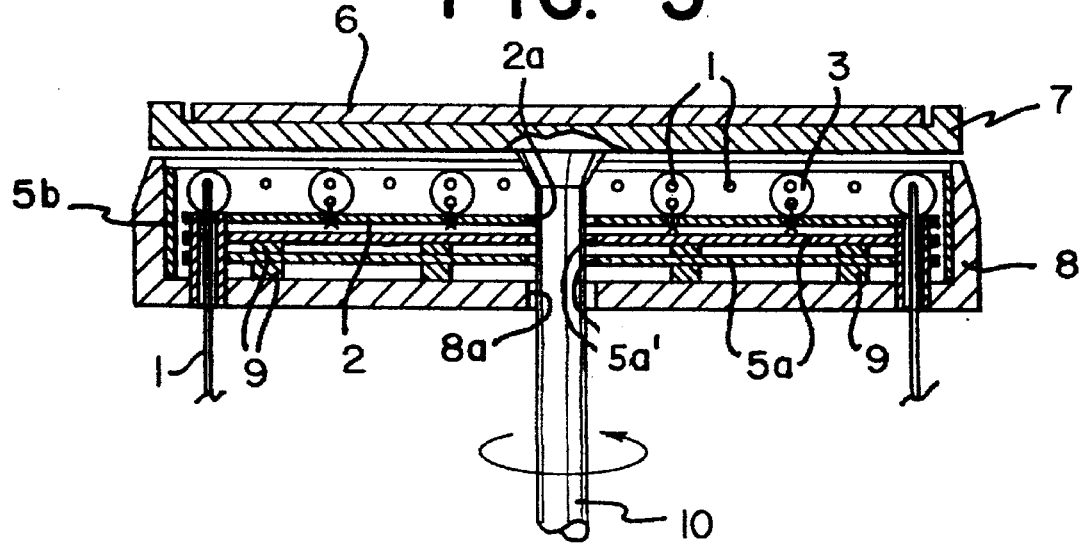
FIG. 5 is a cross-sectional view of the inventive heater of FIG. 1 applied for use with a conventional chemical vapor deposition equipment.

FIG. 5 is a cross sectional view of the heater of FIG. 1 as applied for use with a chemical vapor deposition equipment. As shown in this drawing, the heater of the present invention is placed within a space defined between a substrate supporting susceptor 7 and a heater housing 8. Laid upon the susceptor 7 is a substrate 6 to be heated. At this time, the bottom heat resisting plate 5a is supported by a plurality of heat resisting plate fixtures 9 that are installed in the bottom of the heater housing 8. In the preferred embodiment, the heater is provided with two bottom heat resisting plates 5a. Mounted on an interior surface of the side wall of the heater housing 8 is a side heat resisting plate 5b for prevention of lateral radiation of the heat of the heating wire 1.

In the same manner as described for both the heater disc 2 and the bottom heat resisting plate 5a, the heater housing 8 is holed at its bottom center so as to form therethrough a rotating shaft receiving hole 8a.

In the embodiment shown in FIG. 5, all of the heater disc 2, the bottom heat resisting plate 5a and the heater housing 8 are provided with their respective holes therethrough for passing the ends of the heating wire 1 downward therefrom. Meanwhile, when the heater is placed out of the reactor of the chemical vapor deposition equipment, the heater may be placed inside a hermetic heater housing and inert gas such as argon gas may be introduced into the heater housing in order for prevention of possible oxidation of the heating wire and other elements made of molybdenum or tungsten.

As described above, in the heater according to the present invention, the heating element is a heating wire that may be readily changed in its shape and size as demands dictate. The heater is also stable for general gases such as nitrogen, argon, helium, hydrogen and ammonia at a high temperature not less than 1500° C. and usable in a vacuum up to about $10^4$ Torr.

Other advantages of the instant heater reside in that the heater is relatively cheap, is readily produced and is usable used with chemical vapor deposition equipment having a rotatable susceptor.

Although the embodiments of the present invention has been disclosed for illustrative purposes, those skilled in the art will appreciate that various modifications, additions and substitutions are possible without departing from the scope and spirit of the invention as recited in the accompanying claims.

What is claimed is:

1. A heater for chemical vapor deposition equipment comprising:
    a meandering heating wire, said wire being bent in a plane;
    a heater disc, said disc supporting said heating wire thereupon;
    a plurality of heating wire fixtures for supporting said heating wire, at spaced points along said wire, on said heater disc while spacing said heating wire from a top surface of said heater disc at a predetermined interval, each said heating wire fixture having a heating wire through hole defined within the said fixture through which said heating wire is enclosed and raised and by which said heating wire is supported; and
    a plurality of heat resisting plates for prevention of lateral and downward radiation of heat from said heating wire, said heat resisting plates being placed laterally of and below said heater plate respectively.

2. A heater for chemical vapor deposition equipment as set forth in claim 1, wherein said heating wire is made of molybdenum.

3. A heater for chemical vapor deposition equipment as set forth in claim 1, wherein said heating wire is made of tungsten.

4. A heater for a chemical vapor deposition equipment as set forth in claim 1, wherein said heater disc is holed at its center so as to form therethrough a hole for receiving a susceptor rotating shaft.

5. A heater for chemical vapor deposition equipment as set forth in claim 1, wherein each of said heating wire fixture means further include a fixing wire through hole, said heating wire hole being formed in an upper section of each said fixture means, and said fixing wire hole being formed in a lower section of each said fixture means, said heating wire hole receiving said heating wire while said fixing wire hole receiving a fixing wire for fixing each said fixture means to said heater disc.

6. A substrate heater for heating a susceptor, said heater comprising:
    a heater disc;
    a heat resisting plate spaced below and laterally around said heater disc;
    a meandering heating wire bent in a plane;
    a plurality of heating wire fixtures at predetermined intervals along said heating wire, said heating wire fixtures being fixed to said heater disc, each of said heating fixtures having a heating wire through hole defined therein, said heating wire through hole enclosing and maintaining said heating wire spaced above said heater disc and exposed between said spaced fixtures to permit direct radiation of heat from said heating wire to said heater disc;
    a susceptor spaced above said heating wire; and
    a rotating shaft;
    wherein a hole is defined in each of said heater disc said rotating shaft passing through said holes to rotate said heater disc and said heat resisting plate.

* * * * *